United States Patent
Jin et al.

(10) Patent No.: US 6,875,684 B2
(45) Date of Patent: Apr. 5, 2005

(54) METHOD FOR FORMING A BIT LINE OF A SEMICONDUCTOR DEVICE

(75) Inventors: Sung-gon Jin, Gyunggi-do (KR); In-cheol Ryu, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 291 days.

(21) Appl. No.: 10/183,738

(22) Filed: Jun. 27, 2002

(65) Prior Publication Data

US 2003/0003720 A1 Jan. 2, 2003

(30) Foreign Application Priority Data

Jun. 27, 2001 (KR) .......................................... 2001-37241

(51) Int. Cl.⁷ .......................................... H01L 21/4763
(52) U.S. Cl. ....................................................... 438/618
(58) Field of Search ................................ 438/783, 738, 438/710, 648, 637, 623, 618–621, 585, 584, 241, 629, 638, 672, 675, 688, 597, 596; 257/750, 650, 634, 310

(56) References Cited

U.S. PATENT DOCUMENTS

| | | | | |
|---|---|---|---|---|
| 5,411,911 A | * | 5/1995 | Ikeda et al. | 438/246 |
| 5,840,621 A | * | 11/1998 | Kasai | 438/618 |
| 6,188,115 B1 | | 2/2001 | Kamitani | 257/412 |
| 6,197,673 B1 | | 3/2001 | Yu | 438/595 |
| 6,294,451 B1 | * | 9/2001 | Yoshizawa | 438/597 |

* cited by examiner

Primary Examiner—Carl Whitehead, Jr.
Assistant Examiner—Monica D. Harrison
(74) Attorney, Agent, or Firm—Marshall, Gerstein & Borun LLP

(57) ABSTRACT

A method for forming a bit line of a semiconductor device, in which tungsten is deposited just after depositing a metallic barrier layer, a nitride layer is deposited after forming a bit line to prevent the bit line from oxidation due to the exposure of tungsten, and then a rapid thermal treatment is performed, whereby the contact resistance of the bit line is stabilized, and an additional process of depositing TiN due to the micro crack generated by the rapid thermal treatment is not needed, so the manufacturing process becomes simple and the productivity of manufacturing the semiconductor device is improved.

18 Claims, 5 Drawing Sheets

METHOD FOR FORMING A BIT LINE OF A SEMICONDUCTOR DEVICE

BACKGROUND OF THE DISCLOSURE

1. Field of the Disclosure

The disclosure relates to a method for forming a bit line of a semiconductor device and, more particularly, to a method for forming a bit line of a semiconductor device, in which tungsten is deposited just after depositing a metallic barrier layer, a nitride layer is deposited after forming a bit line to prevent the bit line from oxidation due to the exposure of tungsten, and then a rapid thermal treatment is performed, whereby the contact resistance of the bit line is stabilized, and an additional process of depositing TiN due to the micro crack generated by the rapid thermal treatment is not needed, so the manufacturing process becomes simple and the productivity of manufacturing the semiconductor device is improved.

2. Description of Related Art

The degree of integration and processing speed of semiconductor memory devices, especially dynamic random access memory (DRAM), have steadily increased. In order to make high speed devices, it is necessary to secure a stable contact resistance and to reduce the sheet resistance of a bit line and a word line. Therefore, there is a need to use a material of low resistance in forming a line. For example, in forming a word line of a DRAM, polysilicon has been used for 4 megabytes DRAM, and tungsten silicide was used for 16 megabytes DRAM. There have been continuous attempts to use titanium silicide having a resistance lower than such a material in manufacturing a DRAM of greater integrity than one gigabyte, and even a pure metal such as tungsten having an even lower resistance than silicide has been seriously considered.

As is well-known, the sub-layer formed with a bit line contact is composed of an impurity diffusion area (N− type or P+ type impurity area) of a peripheral circuit area, a tungsten silicide layer of a gate electrode, or a polysilicon pad of an active area. A barrier material is required to lower the contact resistance between the different areas and prevent the current leakage, and a titanium/titanium nitride layer construction has generally been used as the barrier material. Also, tungsten is used as the bit line material. Here, titanium reacts with silicon exposed at the lower area during the subsequent thermal treatment to form titanium silicide ($TiSi_x$), which improves the contact resistance, and the titanium nitride layer functions as a protecting layer for preventing the instability of interface by protecting the permeation of fluorine gas generated by the subsequent deposition process of tungsten, to the lower layer material.

Hereinafter, a conventional method for forming a bit line of a semiconductor is illustrated with reference to the accompanying drawings.

FIG 1A through FIG. 1G are cross-sectional views for illustrating consecutive steps of a conventional method for forming a bit line of a semiconductor device.

As shown in FIG. 1A, a first insulation layer 12 is formed on a semiconductor substrate 11, and a hole is formed to expose the substrate by removing a part of the first insulation layer 12. A plug 13 is then formed by filling up the hole with polysilicon, a second insulation layer 14 is formed on the first insulation layer 12 including the plug 13, and the upper side of the second insulation layer 14 is planarized.

As shown in FIG. 1B, a trench is formed to form a bit line by etching the second insulation layer 14 so that the plug 13 is exposed.

At this time, the width of line is about 0.20 $\mu$m to 0.25 $\mu$m of CD (critical dimension) in the case of using a DUV (Deep Ultraviolet) stepper.

Here, to make the line narrower, a third insulation layer 15 forming a sidewall on the overall surface including the trench is thinly formed.

In that situation, the third insulation layer 15 is formed by lower pressure deposition providing superior step coverage.

As shown in FIG. 1C, a photoresist 16 is spread on the front surface of the third insulation layer 15, and then the photoresist 16 is patterned.

As shown in FIG. 1D, an etching process is performed by using the patterned photoresist 16 as a mask, to form a contact hole 17b exposing the bit line contact 17a and the semiconductor substrate 11.

The etching at this time is dry etching.

FIG. 1E shows a region designated 'A' in FIG. 1D in detail. After the bit line contact 17a is formed, a cleaning process is performed to remove a natural oxide layer in the bit line contact 17a.

Also, a barrier layer 18 composed of a titanium (Ti) layer and a titanium nitride (TiN) layer is formed on a front surface including the contact 17a, in order to reduce the contact resistance of the bit line.

After that, a titanium silicide ($TiSi_2$) layer 19 is formed on the barrier layer 18 by thermal treatment at high temperature, in order to minimize the contact resistance with respect to the substrate 11.

In such a situation, the titanium silicide layer 19 is formed so as not to come into contact with an overhang area in the bit line contact 17a.

As shown in FIG. 1F, a tungsten layer 20 is formed on the front surface including the titanium silicide layer 19.

Next, as shown in FIG. 1G, a bit line including of the barrier layer 18, the titanium silicide layer 19, and the tungsten layer 20 is formed by a CMP (chemical-mechanical planarization) process.

However, in such a conventional method, to prevent the cohesion of $TiSi_2$ during the rapid thermal treatment at the temperature of 800° C. to 850° C., the titanium (Ti) layer and the titanium nitride (TiN) layer are deposited consecutively before the thermal treatment, and in such a situation, a micro crack is generated on the titanium nitride (TiN) layer by rapid thermal stress, and a defect may occur due to the fluorine gas used while tungsten (W) is being deposited.

SUMMARY OF THE DISCLOSURE

The disclosure provides a method for forming a bit line of a semiconductor device, in which tungsten is deposited just after depositing a metallic barrier layer, a nitride layer is deposited after forming a bit line to prevent the bit line from oxidation due to the exposure of tungsten, and then a rapid thermal treatment is performed, whereby the contact resistance of the bit line is stabilized, and an additional process of depositing TiN, due to the micro crack generated by the rapid thermal treatment, is not needed, so the manufacturing process becomes simple and the productivity of manufacturing the semiconductor device is improved.

More specifically, the disclosure provides a method for forming a bit line of a semiconductor device, including the steps of: forming an impurity area by ion injection on a semiconductor substrate, depositing an insulation layer, and forming a contact hole by trench etching; removing a natural oxide layer and impurities in the contact hole by a cleaning process; forming a metallic barrier layer by depositing a titanium layer and a titanium nitride layer consecutively on the insulation layer; depositing a tungsten layer on the metallic barrier layer; depositing a first nitride layer on the tungsten layer, and forming a bit line by depositing and patterning an anti-reflection layer; depositing a second nitride layer on the anti-reflection layer, for preventing oxidation caused by an exposure of the tungsten; and depositing an oxide layer on the second nitride layer, and stabilizing a contact by thermal treatment.

Preferably, the titanium layer and the titanium nitride layer are deposited consecutively while not being exposed to air (i.e., in the substantial absence of air), the titanium layer preferably has a thickness of 40 Å to 100 Å, and the titanium nitride layer preferably has a thickness of 200 Å to 400 Å.

Further, the step of removing the natural oxide layer and impurities in the contact hole preferably uses a BOE (buffered oxide etchant) solution of 300:1, and the tungsten deposited on the metallic barrier layer preferably has a thickness of 600 Å to 1500 Å.

Furthermore, the second nitride layer deposited to prevent the oxidation caused by the exposure of the tungsten preferably has a thickness of 300 Å to 500 Å, and the thermal treatment after the deposition of the oxide layer is preferably performed at a temperature of 800° C. to 870° C. for 10 seconds to 30 seconds.

BRIEF DESCRIPTION OF THE DRAWINGS

Other aspects of the disclosure will become apparent from the following description of embodiments with reference to the accompanying drawings in which.

DESCRIPTION OF THE PREFERRED EMBODIMENT

Figure 1A:
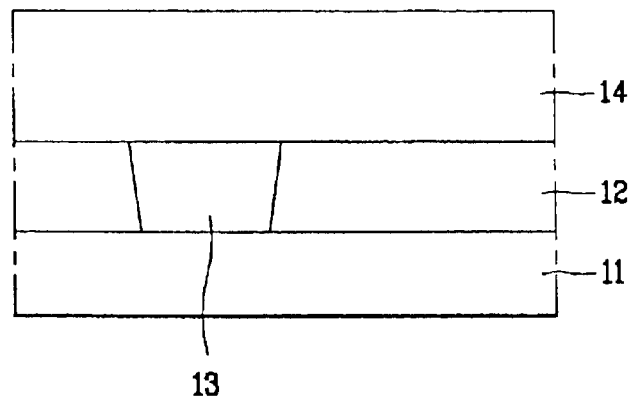
FIG. 1A through FIG. 1G are cross-sectional views for illustrating the consecutive steps of a conventional method for forming a bit line of a semiconductor device.
Figure 1B:
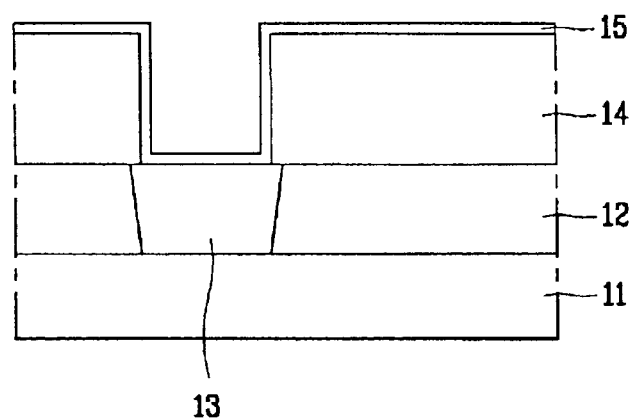
Figure 1C:
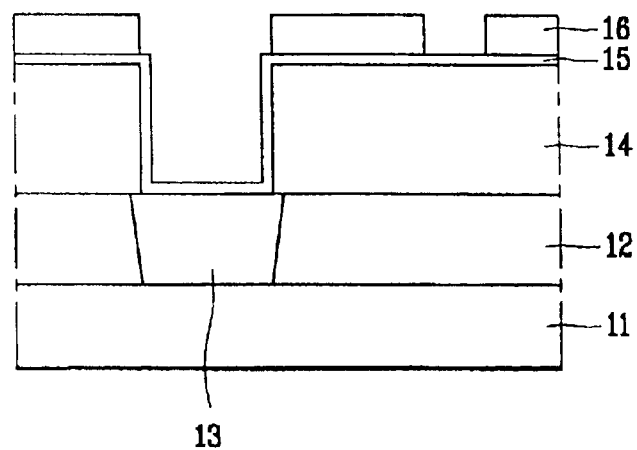
Figure 1D:
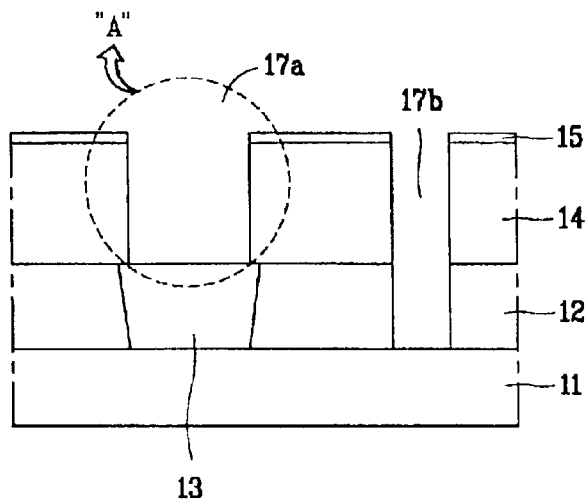
Figure 1E:
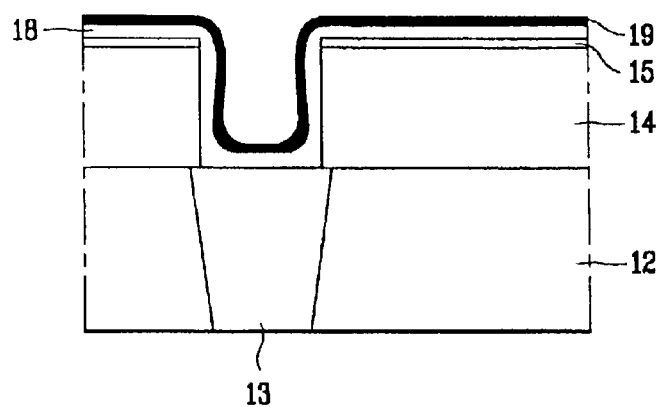
Figure 1F:
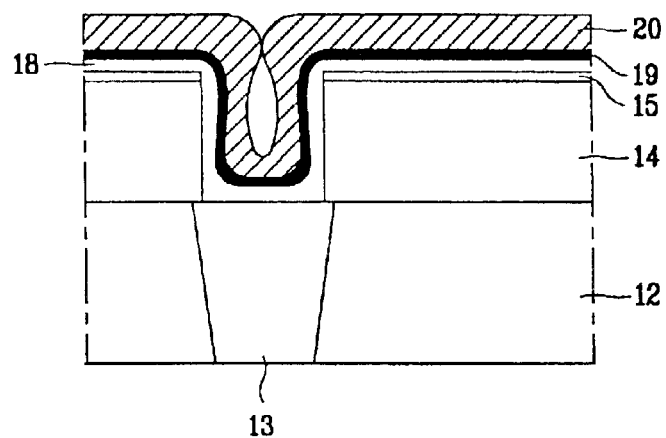
Figure 1G:
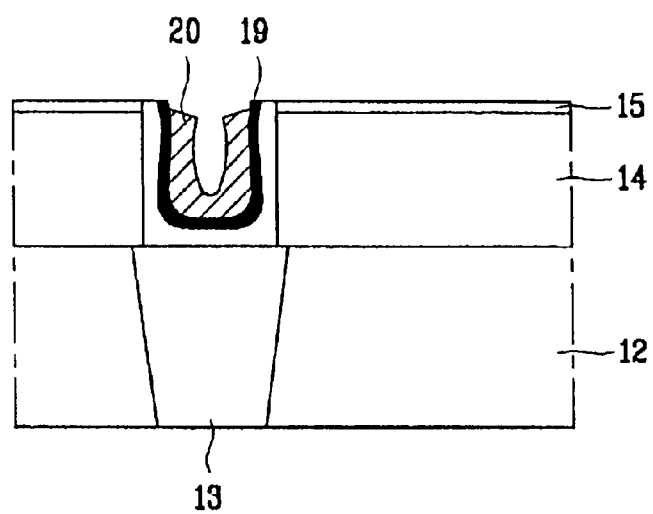

The method will be described in more detail with reference to the accompanying drawings. The disclosed embodiment is only an example of the method, and does not limit the scope thereof. The same parts with the construction of the prior art are referred to with the same reference numerals and names.

FIG. 2A through FIG. 2E are cross sectional views for illustrating consecutive steps of a method for forming a bit line of a semiconductor device.

Figure 2A:
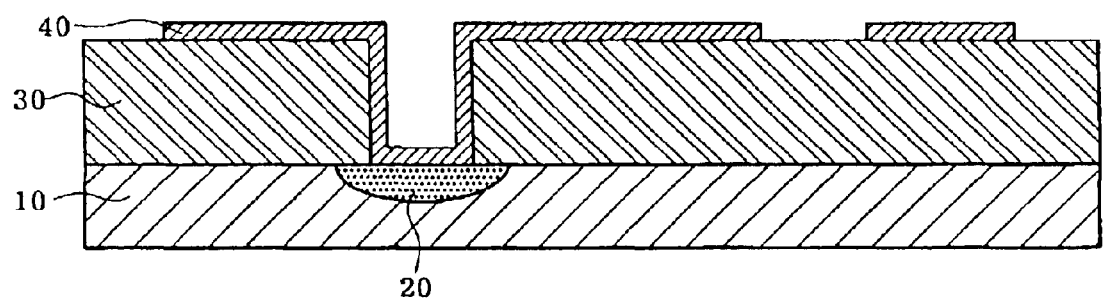
FIG. 2A through FIG. 2E are cross sectional views for illustrating the consecutive steps of a method for forming a bit line of a semiconductor device according to the disclosure.

As shown in FIG. 2A, an impurity area 20 is formed by ion injection on a semiconductor substrate 10, an insulation layer 30 is deposited, and a contact hole is formed by trench etching. Next, the natural oxide layer and other impurities in the contact hole are removed by a cleaning process using BOE solution of 300:1, and the titanium (Ti) layer and the titanium nitride (TiN) layer are deposited consecutively without exposure to air in order to form a metal barrier layer 40.

In this situation, the titanium (Ti) layer is deposited to be 40 Å to 100 Å thick at chamber temperature of 200° C. to 400° C. and at a deposition pressure of 2 mTorr to 30 mTorr.

Further, the titanium nitride (TiN) layer is deposited to be 200 Å to 400 Å thick at chamber temperature of 200° C. to 400° C. and at a deposition pressure of 15 mTorr to 30 mTorr.

Figure 2B:
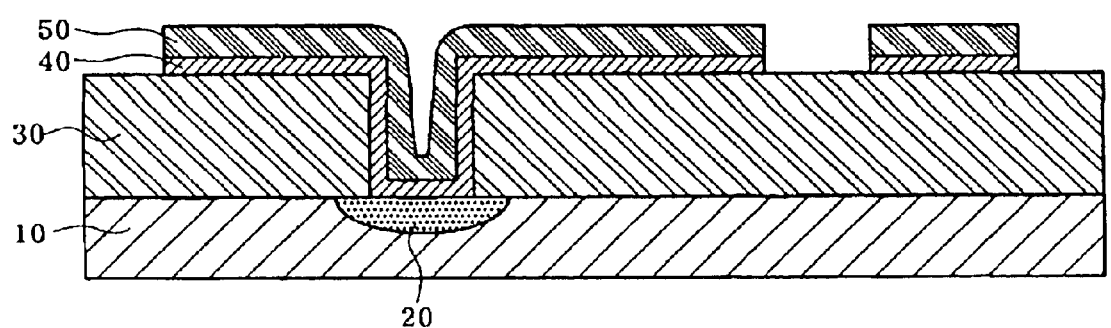
Figure 2C:
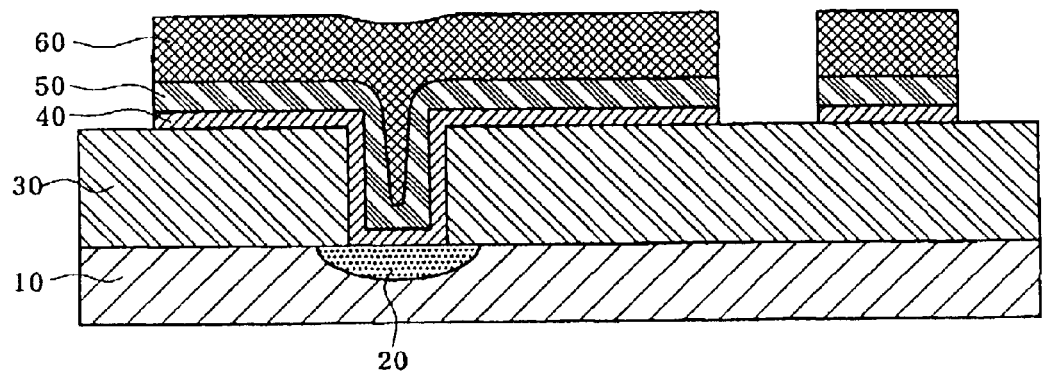

Next, as shown in FIG. 2B, tungsten 50 is deposited at a thickness of 700 Å to 1200 Å, and as shown in FIG. 2C, a first nitride layer 60 is deposited, an anti-reflection layer (not shown) is deposited, and a bit line is formed through a photolithography process by using a resist pattern (not shown).

Figure 2D:
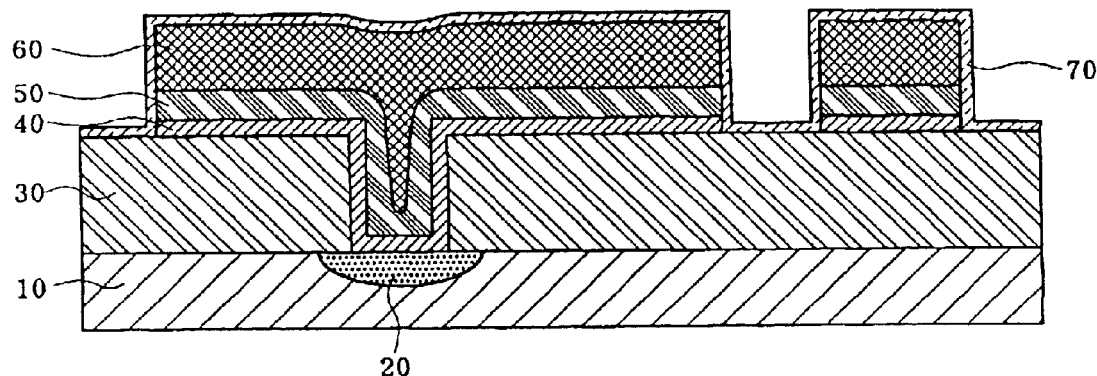
Figure 2E:
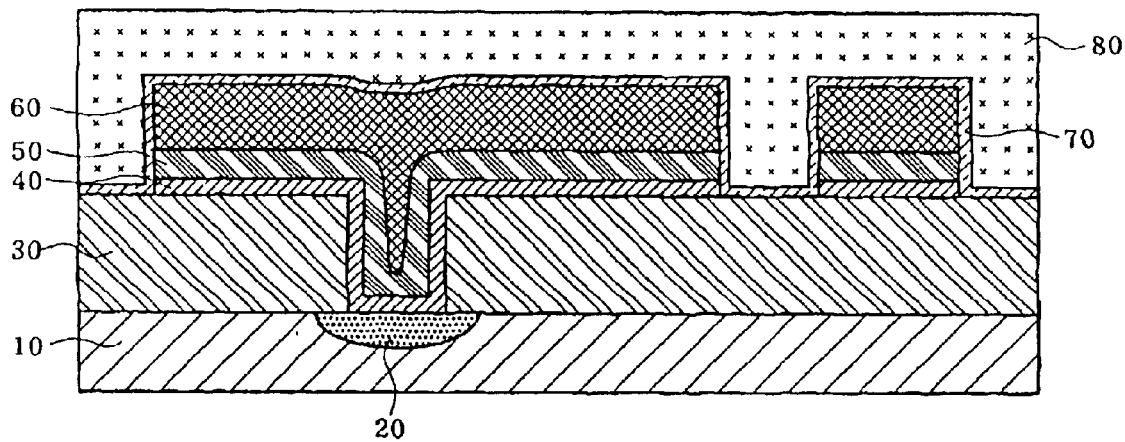

After that, as shown in FIG. 2D, in order to prevent the oxidation of tungsten by the exposure to air, a second nitride layer 70 is deposited at a thickness of 700 Å to 1200 Å, and as shown in FIG. 2E, an HDP (high density plasma) oxidation layer 80 is deposited by a high density plasma method in order for the insulation between the bit lines and the subsequent planarization process. Then, the thermal treatment is performed for 10 seconds to 30 seconds at a temperature of 800° C. to 870° C. in order to stabilize the contact resistance of the bit line.

Figure 3:
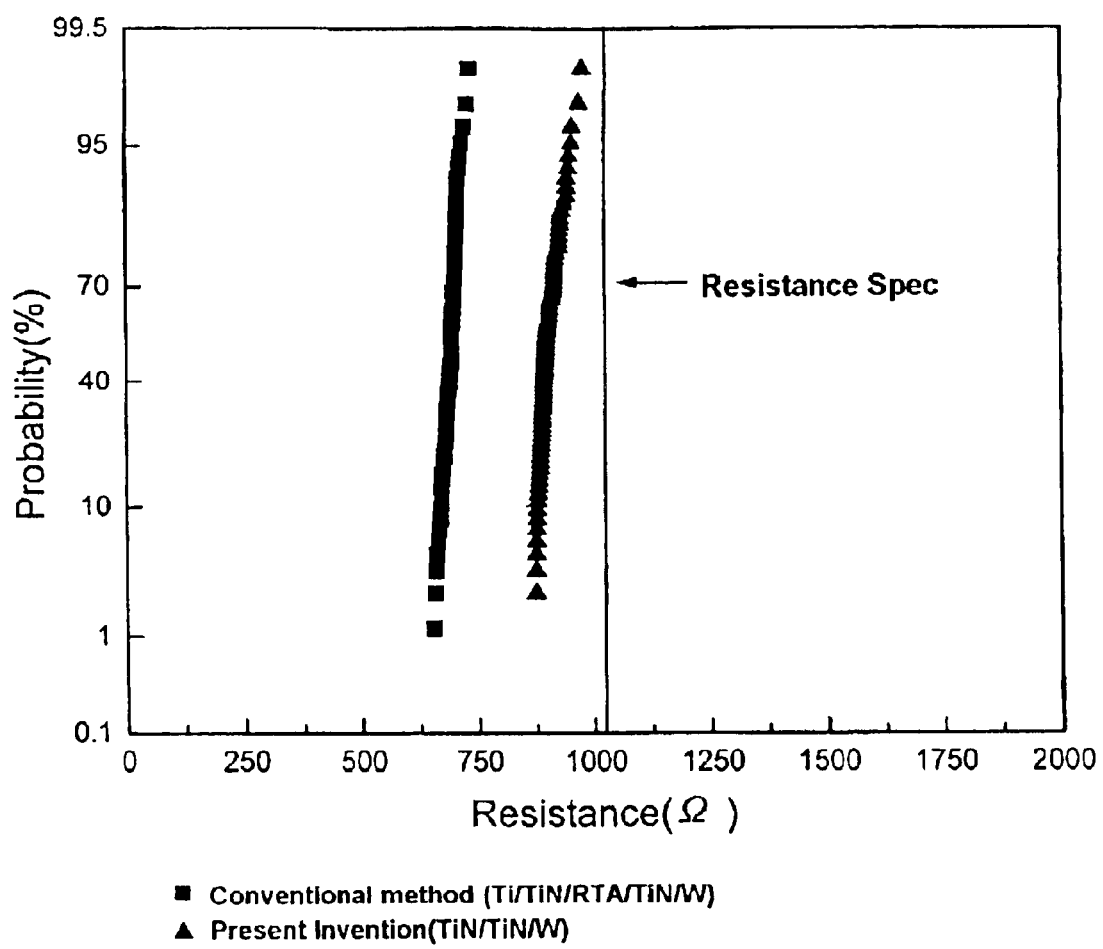
FIG. 3 is a graph for comparing bit line contact of the disclosure with that of the conventional art.

FIG. 3 is a graph for comparing bit line contact of the disclosure with that of the conventional art.

As shown in FIG. 3, the contact resistance increases a little in comparison with the conventional art during the rapid thermal treatment after the patterning of the tungsten bit line, however, due to the reduction of processing steps, the investment for the equipment is reduced and the productivity is improved.

As described above, according to the disclosure, a method for forming a bit line of a semiconductor device is provided, in which tungsten is deposited just after depositing a metallic barrier layer, a nitride layer is deposited after forming a bit line to prevent the bit line from oxidation due to the exposure of tungsten, and then a rapid thermal treatment is performed whereby the contact resistance of the bit line is stabilized, and an additional process of depositing TiN due to the micro crack generated by the rapid thermal treatment is not needed, so the manufacturing process becomes simple and the productivity of manufacturing the semiconductor device is improved.

Although a preferred embodiment of the method has been described, it will be understood by those skilled in the art that the method should not be limited to the described preferred embodiment, but various changes and modifications can be made within the spirit and the scope of the disclosure. Accordingly, the scope of the disclosed method is not limited within the described range but the following claims.

What is claimed is:

1. A method for forming a bit line of a semiconductor device, comprising the steps of:

forming an impurity area by ion injection on a semiconductor substrate;

depositing an insulation layer, and forming a contact hole by trench etching;

removing a natural oxide layer and impurities in the contact hole by a cleaning process;

forming a metallic barrier layer covering the contact hole by consecutively depositing a titanium layer and a titanium nitride layer on the insulation layer;

depositing a tungsten layer directly on the metallic barrier layer and covering a portion of the metallic barrier layer that covers the contact hole;

depositing a first nitride layer on the tungsten layer, and forming a bit line by depositing and patterning an anti-reflection layer;

depositing a second nitride layer on the anti-reflection layer thereby preventing oxidation caused by an exposure of the tungsten; and depositing an oxide layer on the second nitride layer, and performing a thermal treatment whereby contact resistance of the bit line is stabilized.

2. The method of claim 1, comprising depositing the titanium layer and the titanium nitride layer in the substantial absence of air.

3. The method of claim 1, comprising removing the natural oxide layer and impurities in the contact hole using a BOE solution of 300:1.

4. The method of claim 1, comprising depositing the titanium on the insulation layer at a thickness of 40 Å to 100 Å.

5. The method of claim 1, comprising depositing the titanium nitride layer on the insulation layer at a thickness of 200 Å to 400 Å.

6. The method of claim 1, comprising depositing the tungsten layer on the metallic barrier layer at a thickness of 600 Å to 1500 Å.

7. The method of claim 1, comprising depositing the second nitride layer at a thickness of 300 Å to 500 Å.

8. The method of claim 1, comprising performing the thermal treatment after the deposition of the oxide layer at a temperature of 800° C. to 870° C. for 10 seconds to 30 seconds.

9. A method for forming a bit line of a semiconductor device, the method comprising:

forming an impurity area by ion injection on a semiconductor substrate;

depositing an insulation layer, and forming a contact hole in the insulation layer and over the impurity area by trench etching the insulation layer;

forming a metallic barrier layer that covers the contact hole by consecutively depositing a titanium layer and a titanium nitride layer on the insulation layer;

depositing a tungsten layer directly on the metallic barrier layer without etching any portion of the metallic barrier layer disposed in the contact hole;

depositing a first nitride layer on the tungsten layer, and forming a bit line by depositing and patterning an anti-reflection layer;

depositing a second nitride layer on the anti-reflection layer thereby preventing oxidation caused by an exposure of the tungsten; and performing a thermal treatment to stabilize contact resistance of the bit line.

10. The method of claim 9 further comprising removing a natural oxide layer and impurities in the contact hole by a cleaning process prior to forming the metallic barrier layer.

11. The method of claim 9 further comprising depositing an oxide layer on the second nitride layer before performing the thermal treatment.

12. The method of claim 9 further comprising depositing the titanium layer and the titanium nitride layer in the substantial absence of air.

13. The method of claim 9 further comprising removing the natural oxide layer and impurities in the contact hole using a BOE solution of 300:1.

14. The method of claim 9 further comprising depositing the titanium on the insulation layer at a thickness of 40 Å to 100 Å.

15. The method of claim 9 further comprising depositing the titanium nitride layer on the insulation layer with a thickness of 200 Å to 400 Å.

16. The method of claim 9 further comprising depositing the tungsten layer on the metallic barrier layer with a thickness of 600 Å to 1500 Å.

17. The method of claim 9 further comprising depositing the second nitride layer with a thickness of 300 Å to 500 Å.

18. The method of claim 11 further comprising performing the thermal treatment after the deposition of the oxide layer at a temperature of 800° C. to 870° C. for 10 seconds to 30 seconds.

* * * * *